United States Patent
Chen et al.

(10) Patent No.: US 10,461,446 B2
(45) Date of Patent: Oct. 29, 2019

(54) WELDING COLUMN COMBINATION AND POWER SUPPLY MODULE THEREOF

(71) Applicant: Delta Electronics (Thailand) Public Company Limited, Samutprakarn (TH)

(72) Inventors: Shao-Jun Chen, Samutprakarn (TH); Da Jin, Samutprakarn (TH); Ya-Hong Xiong, Samutprakarn (TH)

(73) Assignee: DELTA ELECTRONICS (THAILAND) PUBLIC COMPANY LIMITED, Samutprakarn (TH)

( * ) Notice: Subject to any disclaimer, the term of this patent is extended or adjusted under 35 U.S.C. 154(b) by 0 days.

(21) Appl. No.: 16/045,718

(22) Filed: Jul. 25, 2018

(65) Prior Publication Data

US 2019/0252809 A1     Aug. 15, 2019

(30) Foreign Application Priority Data

Feb. 12, 2018  (CN) .......................... 2018 1 0146993

(51) Int. Cl.
| | | |
|---|---|---|
| H05K 1/00 | (2006.01) | |
| H01R 12/52 | (2011.01) | |
| H05K 1/14 | (2006.01) | |
| H01R 4/70 | (2006.01) | |
| H01R 4/02 | (2006.01) | |

(52) U.S. Cl.
CPC ............. *H01R 12/52* (2013.01); *H01R 4/029* (2013.01); *H01R 4/70* (2013.01); *H05K 1/144* (2013.01); *H05K 2201/042* (2013.01); *H05K 2201/1031* (2013.01)

(58) Field of Classification Search
CPC .......... H01R 12/52; H01R 4/029; H01R 4/70; H05K 1/144; H05K 2201/042; H05K 2201/1031
See application file for complete search history.

(56) References Cited

U.S. PATENT DOCUMENTS

| | | | |
|---|---|---|---|
| 2006/0158863 A1* | 7/2006 | Hsu | H01L 23/49816 361/760 |
| 2009/0175014 A1 | 7/2009 | Zeng et al. | |
| 2014/0085850 A1* | 3/2014 | Li | H05K 1/0231 361/773 |
| 2017/0040239 A1* | 2/2017 | Glenn | H01L 23/49562 |

* cited by examiner

*Primary Examiner* — Pete T Lee
(74) *Attorney, Agent, or Firm* — CKC & Partners Co., LLC

(57) ABSTRACT

A welding column combination includes at least two metal welding columns and at least one insulator block. Each metal welding column has a first end and a second end opposite to the first end, wherein at least one of the metal welding columns has welding surfaces at the first end and the second end respectively. The at least one insulator block assembles the at least two metal welding columns as a unitary physical combination.

14 Claims, 9 Drawing Sheets

WELDING COLUMN COMBINATION AND POWER SUPPLY MODULE THEREOF

CROSS-REFERENCE TO RELATED APPLICATION

This application claims priority to China Application Serial Number 201810146993.1, filed Feb. 12, 2018, which is herein incorporated by reference in its entirety.

BACKGROUND

Field of Invention

The present invention relates to an electrical connector and a power supply module utilizing the electrical connector. More particularly, the present invention relates to an electrical connector utilized in a SMD (Surface Mount Device) process and a power supply module utilizing the electrical connector.

Description of Related Art

The power supply modules are developed towards smaller volumes and higher output power densities. Therefore, how to make the output power density higher within a smaller volume is a practical problem faced by the power supply modules.

The planar space of the power supply module is limited, and its three-dimensional space can be effectively utilized in order to increase the output power density. A power supply module with multiple stacked circuit boards can fully utilize the height direction of the power module to increase its integration and output power density.

At present, within the power supply module with multiple stacked circuit boards, a electrical connection among stacked circuit boards is usually realized by using a single copper block, and a height/width ratio of the single copper block is small. If the single copper block has a large height and a small width, there will be a process risk: for example, 1) during the process of surface mounted devices (SMD), when the single copper block is welded to the circuit board, a center of gravity for the single copper block is too high such that it cannot reliably stand upright and fall easily; 2) during the SMD process, multiple copper blocks needs to be absorbed several times; 3) After a first welding surface of the copper block is welded on the first circuit board, the solder between the first welding surface of the copper block and the first circuit board is likely melted again when a second welding surface of the copper block is welded to the second circuit board, the copper block is likely to fall because the center of gravity for the copper block is further lifted and the first circuit board is added above the copper block as a load.

SUMMARY

The disclosure provides an inventive welding column combination to resolve the above-discussed problems in the SMD process.

According to embodiments of the present disclosure, a welding column combination includes at least two metal welding columns and at least one insulator block. Each metal welding column has a first end and a second end opposite to the first end, wherein at least one of the metal welding columns has welding surfaces at the first end and the second end respectively. The at least one insulator block assembles the at least two metal welding columns as a unitary physical combination.

According to embodiments of the present disclosure, a height/width ratio of at least one of the at least two metal welding columns is greater than or equal to one.

According to embodiments of the present disclosure, a height/width ratio of at least one of the at least two metal welding columns is less than one.

According to embodiments of the present disclosure, a material of each metal welding column comprises copper, copper alloys, silver or silver alloys.

According to embodiments of the present disclosure, a material of the insulator block is made from plastic.

According to embodiments of the present disclosure, a height/width ratio of the welding column combination is less than two.

According to embodiments of the present disclosure, the insulator block includes at least one insulation gap portion and at least two protrusion engaging portions, the insulation gap portion is configured to space adjacent-two of the at least two metal welding columns from each other.

According to embodiments of the present disclosure, each protrusion engaging portion has a width near the insulation gap portion less than a width away from the insulation gap portion.

According to embodiments of the present disclosure, the at least two metal welding columns are of the same shapes or different shapes.

According to embodiments of the present disclosure, each metal welding column has at least one through hole or concave slot configured to be inserted by a corresponding one of the at least two protrusion engaging portions.

According to embodiments of the present disclosure, each protrusion engaging portion has a rectangular, semicircular or triangular cross section.

According to embodiments of the present disclosure, one of the at least two metal welding columns has an open slot at the first end or the second end, or has an open slot at the first end and the second end.

According to embodiments of the present disclosure, the at least two metal welding columns are level at the first ends and not level at the second ends; or the at least two metal welding columns are not level at the first ends and not level at the second ends; or the at least two metal welding columns are level at the first ends and level at the second ends.

According to embodiments of the present disclosure, the at least two metal welding columns have welding surfaces at the first ends and the second ends.

According to embodiments of the present disclosure, a power supply module includes at least one circuit board and at least one welding column combination. The welding column combination is installed on the at least one circuit board and the welding surfaces of the at least two metal welding columns are welded to the at least one circuit board. The welding column combination includes at least two metal welding columns and at least one insulator block. Each metal welding column has a first end and a second end opposite to the first end, wherein at least one of the metal welding columns has welding surfaces at the first end and the second end respectively. The at least one insulator block assembles the at least two metal welding columns as a unitary physical combination.

According to embodiments of the present disclosure, the at least one circuit board includes a first circuit board and a second circuit board, wherein at least one of the at least two metal welding columns has the welding surface at the first end and the welding surface at the second end, which are welded to the first circuit board and the second circuit board respectively.

According to embodiments of the present disclosure, the at least one circuit board is a system board.

According to embodiments of the present disclosure, the at least one circuit board is a printed circuit board or aluminum based circuit board.

According to embodiments of the present disclosure, a surface of the at least one circuit board is in contact with the welding surfaces of the at least two metal welding columns, and the surface of the at least one circuit board has at least one convex portion.

According to embodiments of the present disclosure, the at least two metal welding columns have the welding surfaces at the first end and the second end.

It is to be understood that both the foregoing general description and the following detailed description are by examples, and are intended to provide further explanation of the disclosure as claimed.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a silicon nitride layer includes embodiments having two or more such silicon nitride layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

The present disclosure provides a power supply module in one aspect and provides a welding column combination in another aspect. The welding column combination may be utilized in a SMD process to serve as an electrical connection and support component within the power supply module. The power supply module herein includes at least one circuit board and one welding column combination, wherein the welding column combination is installed on the circuit board, and the welding surfaces on the first end or second end of the at least two metal welding columns are welded to the at least one circuit board. Embodiments are discussed with the welding column combinations and the power supply module as illustrated in FIG. 1-16.

Figure 1:
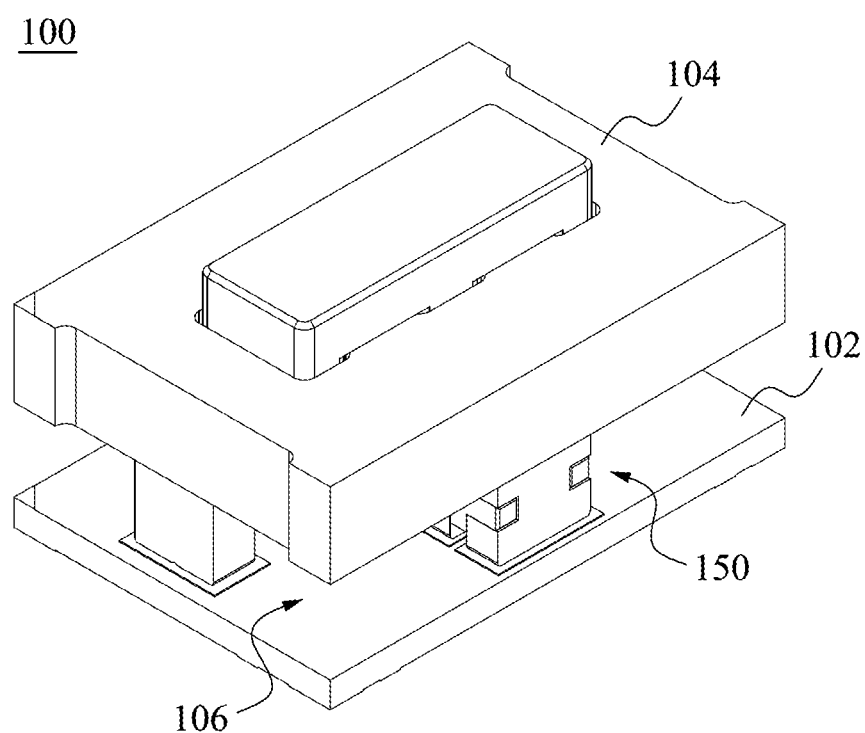
FIG. 1 illustrates a perspective view of a power supply module in accordance with an embodiment of the present disclosure.
Figure 2:
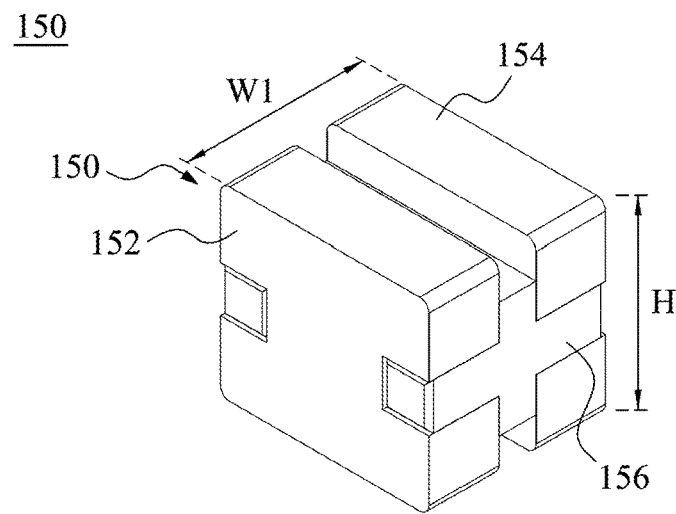
FIG. 2 illustrates a perspective view of a welding column combination in accordance with an embodiment of the present disclosure.
Figure 3:
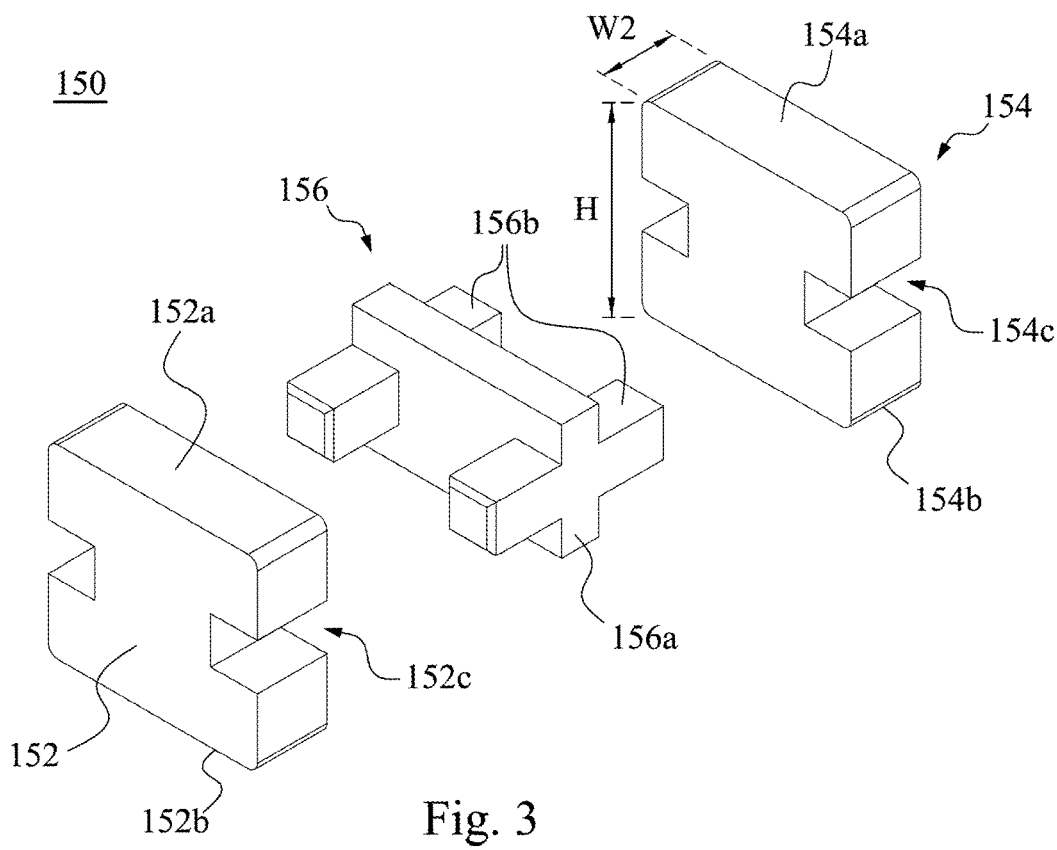
FIG. 3 illustrates an exploded view of the welding column combination in FIG. 2.

Reference is made to FIGS. 1-3, FIG. 1 illustrates a perspective view of a power supply module in accordance with an embodiment of the present disclosure; FIG. 2 illustrates a perspective view of a welding column combination in accordance with an embodiment of the present disclosure; and FIG. 3 illustrates an exploded view of the welding column combination in FIG. 2.

In this embodiment, a power supply module 100 includes two circuit boards, e.g., a first circuit board 104 and a second circuit board 102, wherein the first circuit board 104 is located above the second circuit board 102. The first circuit board 104 and the second circuit board 102 are stacked, and electrically connected by means of the welding column combination 150. That is, the welding column combination 150 has a welding surface 152*a*, 154*a* on its first end welded to the first circuit board 104. And the welding column combination 150 has a welding surface 152*b*, 154*b* on its second end welded to the second circuit board 102. Therefore, the welding column combination 150 serves as an electrical connection through which large current between the first circuit board 104 and the second circuit board 102 flows. In this embodiment, the welding column combination 150 also serves as a support structure between the first circuit board 104 and the second circuit board 102 such that an accommodation space 106 is formed between the first circuit board 104 and the second circuit board 102 to accommodate electrical components on the first circuit board 104 and/or the second circuit board 102. The accommodation space 106 can accommodate more components. The welding column combination 150 also effectively enhances the integration and power density of the power supply module 100. In this embodiment, the first circuit board 104 may be a power circuit board, and the second circuit board 102 may be a control circuit board. In other embodiments, the first circuit board 104 or second circuit board 102 may be a printed circuit board, an aluminum based circuit board and/or a client system board.

In other embodiments, the power supply module may include single one circuit board, e.g., the first circuit board 104 or second circuit board 102, the welding column combination 150 is installed on the circuit board, and at least one metal welding column has its welding surface (on its first end or its second end) electrically connected to the circuit board. That is, the welding column combination 150 has a welding surface on its first end welded to the circuit board, or the welding column combination 150 has a welding surface on its second end welded to the circuit board to serve as an electrical connection through which large current flows to an external component.

In other embodiments, the power supply module may include two or more circuit boards, e.g., the first circuit board 104, the second circuit board 102, and/or additional circuit boards are stacked with the welding column combination 150 between adjacent two circuit boards to serve as the electrical connection.

The welding column combination 150 includes at least two metal welding column, e.g., the metal welding column 152, 154 and at least one insulator block, e.g., insulator block 156. Each one metal welding column has a first end and a second end opposite to the first end, wherein the at least one metal welding column has respective welding surfaces at the first end and the second end, e.g., the welding surfaces 152*a*, 154*a*, 152*b*, 154*b*. The metal welding column may be made from copper, copper alloys, silver or silver alloys, and the insulator block may be made from plastic which are utilized to join and insulate adjacent metal welding columns. In this embodiment, the welding column combination 150 has two metal welding columns, e.g., the metal welding column 152 and the metal welding column 154, but not being limited to in actual implementation. The metal welding column combination 150 has a welding surface at its first end welded to the first circuit board 104, and the metal welding column combination 150 has a welding surface at its second end welded to the second circuit board 102. For example, the metal welding column 152 has a welding surface 152*a* and a welding surface 152*b* at the first end and the second end respectively while the metal welding column 154 has a welding surface 154*a* and the welding surface 154*b* at the first end and the second end respectively, wherein the welding surfaces 152*a*, 154*a* are welded to the first circuit board 104, and the welding surfaces 152*b*, 154*b* are welded to the second circuit board 102. In other embodiments, the metal welding column 152 has a welding surface 152*a* and a welding surface 152*b* at the first end and the second end respectively while the metal welding column 154 does not have a welding surface 154*a* and the welding surface 154*b* at the first end and the second end, wherein the metal welding column 152 is coupled to the circuit board to serve as an electrical connection while the metal welding column 154 is not electrically connected to the circuit board and only serves as a support structure. Two metal welding columns 152, 154 are joined or integrated as a unitary physical combination by means of the insulator block 156, and the two metal welding columns 152, 154 have respective first ends aligned or leveled and have respective second ends aligned or level. For example, a first end of the metal welding column 152 is aligned or leveled with a first end of the metal welding column 154, i.e., the welding surface 152*a* is aligned or leveled with the welding surface 154*a*. A second end of the metal welding column 152 is aligned or leveled with a second end of the metal welding column 154, i.e., the welding surface 152*b* is aligned or leveled with the welding surface 154*b*. In this embodiment, two metal welding columns 152, 154 both have a "H-shaped" cross section while the insulator block 156 has a "H-shaped" cross section from a top view and a cross-shaped cross section from a side view.

In order to increase an output power density of the power supply module, density of the electrical components in the power supply module is enhanced, and the electrical components in the first circuit board 104 and the second circuit board 102 are set in the accommodation space 106 as far as possible. That is, each metal welding column of the welding column combination 150 has its height (H) greater than its width (W2), e.g., height/width ratio (H/W2) is greater than two. When a height/width ratio of a single copper block is greater than 2, there will be following risk: for example, 1) during the SMD process, when the single copper block is welded to the circuit board 104, a center of gravity for the copper block is too high such that it cannot reliably stand upright and fall easily; 2) during the SMD process, multiple copper blocks needs to be absorbed by several times; 3) After a first welding surface of the copper block is welded on the first circuit board 104, the solder between the first welding surface of the copper block and the first circuit board 104 is likely melted again when a second welding surface of the copper block is welded to the second circuit board 102, the copper block is likely to fall because the center of gravity for the copper block is further lifted and the first circuit board 104 is added above the copper block as a load. The overall height/width ratio of the welding column combination 150 is less than two, while in the SMD process, a center of gravity for the combination 150 is lowered, and even when the first circuit board is loaded on the welding column combination 150, it can reliably stand upright. And the welding column combination 150 is absorbed one time during the process, thereby improving the efficiency of the SMD process.

Referring to FIG. 2, a height/width ratio (H/W1) of the welding column combination 150 is less than two. In this embodiment, the height/width ratio (H/W1) of the welding column combination 150 is about one.

In other embodiments, a height/width ratio (H/W2) of at least one metal welding column 150 is greater than one; or a height/width ratio (H/W2) of at least one metal welding column has 150 is less than one.

The insulator block 156 includes at least one insulation gap portion 156a and two or more protrusion engaging portions 156b. The insulation gap portion 156a is utilized to space the metal welding columns 152, 154 from each other. In this embodiment, the protrusion engaging portion 156b has a square or rectangular cross section.

In this embodiment, each metal welding column has at least one through hole or concave slot configured to be inserted by a corresponding protrusion engaging portion, e.g., the metal welding column 152 has two concave slots 152c configured to be inserted by the protrusion engaging portions 156b, and the metal welding column 154 has two concave slots 154c configured to be inserted by the protrusion engaging portions 156b.

A height/width ratio (H/W1) of the welding column combination 150 is relatively small, e.g., compared with its metal welding column, as well as low center of gravity such that even if the welding column combination 150 supports the circuit board, it can reliably stand upright and absorbed merely once during a SMD process, which is more efficient than metal welding columns absorbed by several times during the SMD process.

The above-description has detailed the structural and functional relationship between the welding column combination 150 and the power supply module 100, but a structure of the welding column combination is not limited to the welding column combination 150 as discussed above, and more variations of the welding column combination are discussed below.

Figure 4:
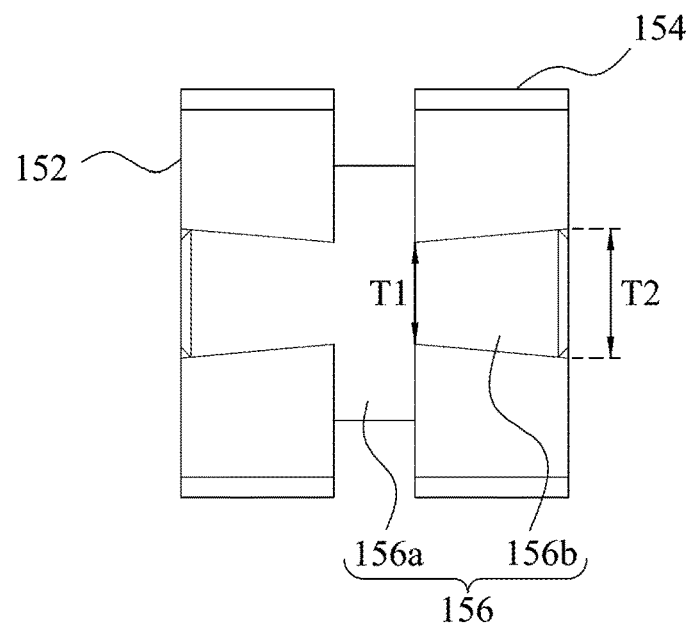
FIG. 4 illustrates a perspective view of a welding column combination in accordance with another embodiment of the present disclosure.

FIG. 4 illustrates a perspective view of a welding column combination 150a in accordance with another embodiment of the present disclosure. Different form the welding column combination 150, each protrusion engaging portion 156b in this embodiment has an unequal thickness and a trapezoidal cross section from a side view, e.g., a width T1 of the protrusion engaging portion 156b near the insulation gap portion 156a is less than a width T2 of the protrusion engaging portion 156b away from the insulation gap portion 156a in order to reliably secure the metal welding columns 152, 154 and the insulator block 156 even during the process of thermal expansion and contraction in high temperature welding process. In this embodiment, two metal welding columns have the same structural shapes.

Figure 5:
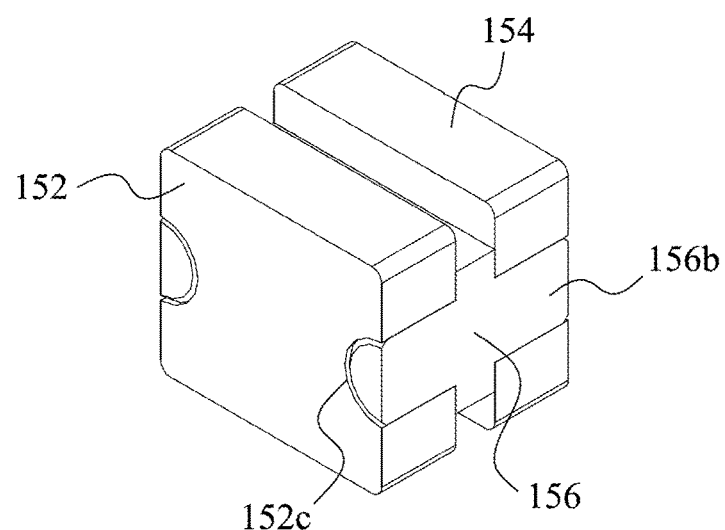
FIG. 5 illustrates a perspective view of a welding column combination in accordance with still another embodiment of the present disclosure.

FIG. 5 illustrates a perspective view of a welding column combination 150b in accordance with still another embodiment of the present disclosure. Different form the welding column combination 150, each protrusion engaging portion 156b in this embodiment has a semicircular cross section, e.g., different from the rectangular cross section illustrated in FIGS. 1-3. Each metal welding column has various concave slots, e.g., concave slots 152c, which also has semicircular cross sections. In this embodiment, two metal welding columns have the same structural shapes.

Figure 6:
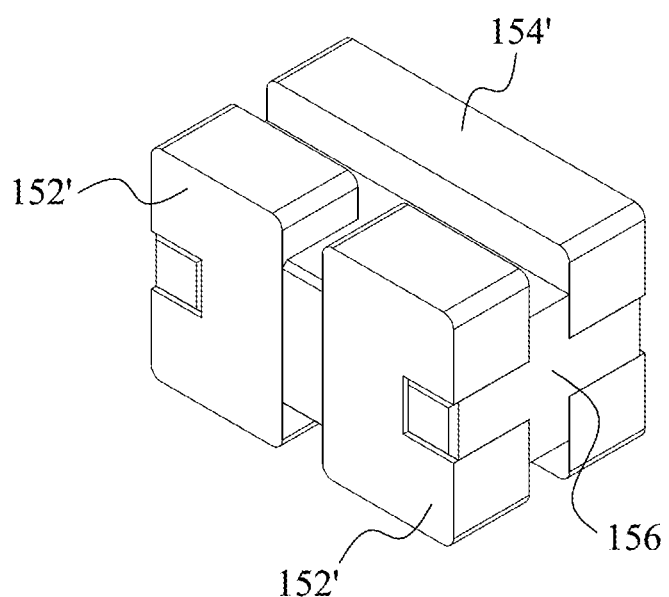
FIG. 6 illustrates a perspective view of a welding column combination in accordance with still another embodiment of the present disclosure.

FIG. 6 illustrates a perspective view of a welding column combination 150c in accordance with still another embodiment of the present disclosure. Different form the welding column combination 150, the welding column combination 150c in this embodiment includes 3 metal welding columns 154', 152', 152', e.g., the metal welding columns may have various structures used with the insulator block 156 according to actual demands. Two metal welding columns 152' are of the same structural shapes and arranged aligned with each other, but different from the metal welding column 154' in shape. And the two metal welding columns 152' are arranged parallel with the metal welding column 154'. Each metal welding column 152' has a smaller welding surface than a welding surface of the metal welding column 154'.

Figure 7:
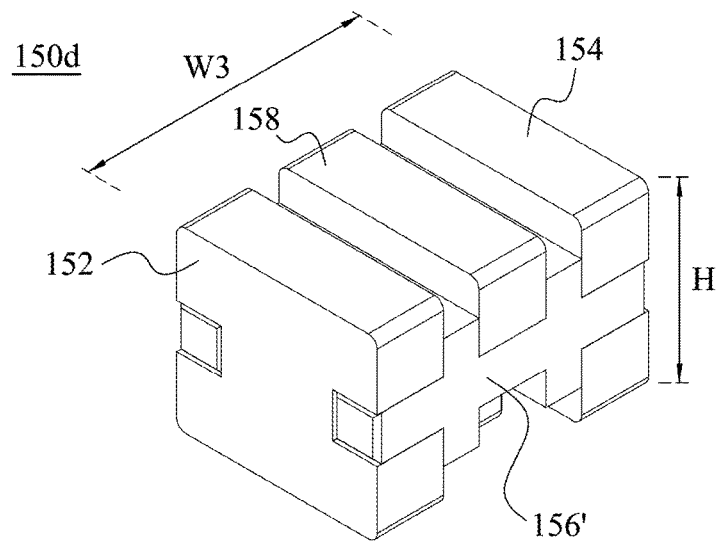
FIG. 7 illustrates a perspective view of a welding column combination in accordance with still another embodiment of the present disclosure.
Figure 8:
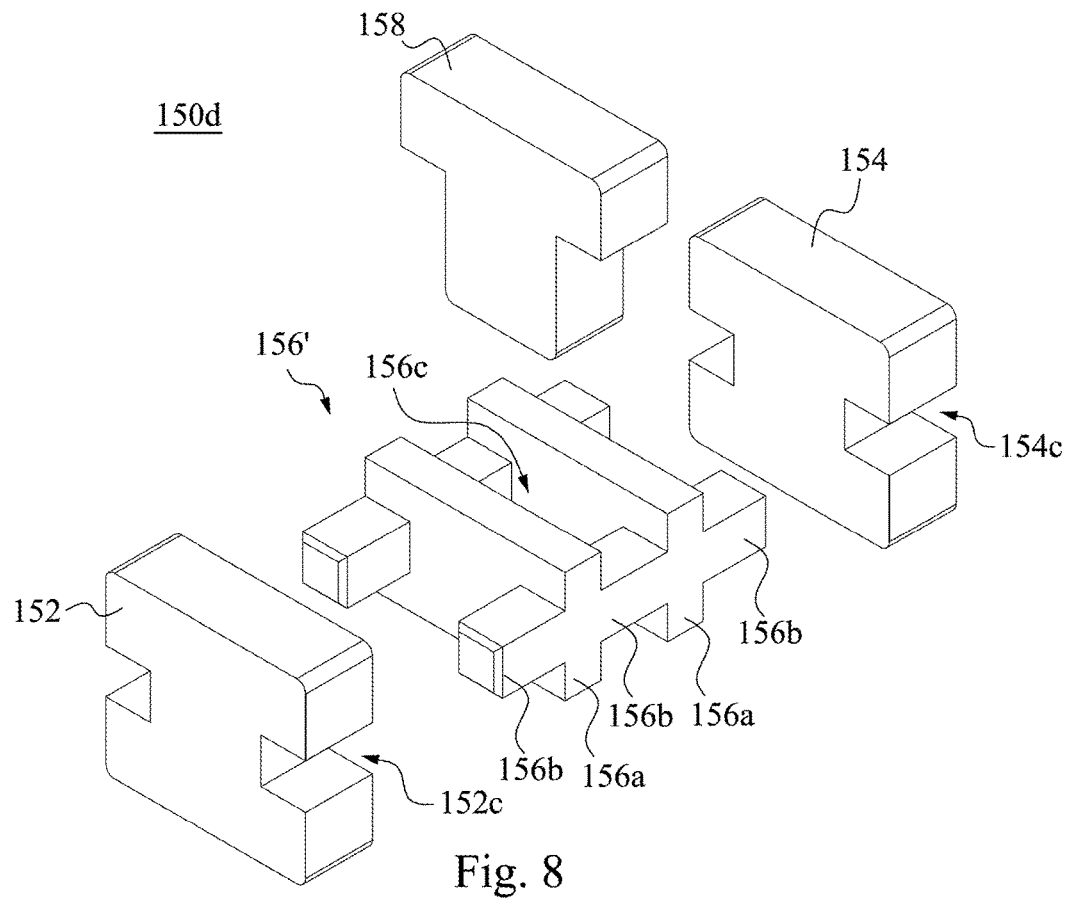
FIG. 8 illustrates an exploded view of the welding column combination in FIG. 7.

FIG. 7 illustrates a perspective view of a welding column combination 150d in accordance with still another embodiment of the present disclosure, and FIG. 8 illustrates an exploded view of the welding column combination 150d. Different from the welding column combination 150c, the welding column combination 150d in this embodiment, includes 3 metal welding columns 152, 154, 158 in parallel. In particular, the metal welding columns 152, 154, 158 have their respective upper and lower welding surfaces paralleled in lengthwise direction. The metal welding columns 152, 154 both have an "H-shaped" cross section, and the metal welding column 158 has a "T-shaped" cross section. The insulator block 156' is an insulator block of a "#" shape, which has a center through hole 156c configured to be inserted by the "T-shaped" metal welding column 158. The insulator block 156' also has protrusion engaging portions 156b at opposite sides to be inserted into corresponding concave slots 152c, 154c of the metal welding column 152, 154. In this embodiment, the welding column combination 150d has its height/width ratio (H/W3) less than 1, and the insulator block 156' has a "#" shape from a top view and a "double-cross" shape from a side view.

Figure 9:
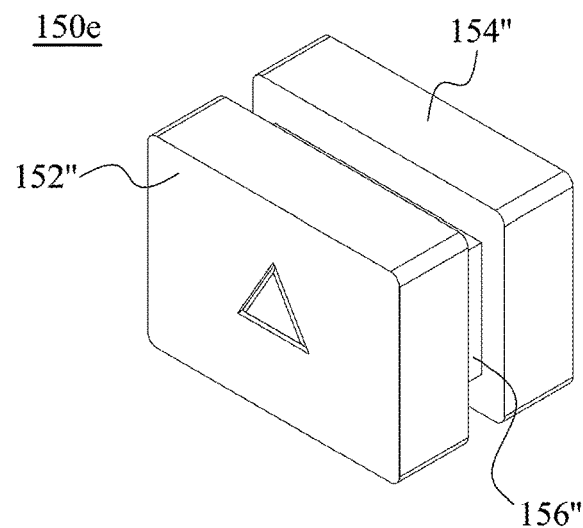
FIG. 9 illustrates a perspective view of a welding column combination in accordance with still another embodiment of the present disclosure.
Figure 10:
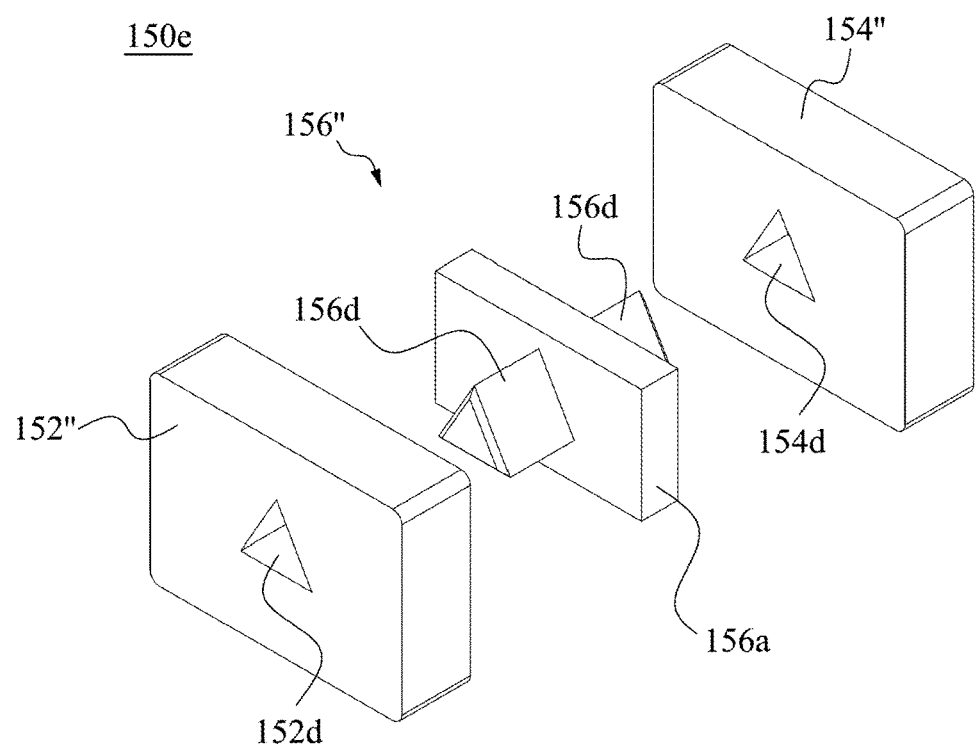
FIG. 10 illustrates an exploded view of the welding column combination in FIG. 9.

FIG. 9 illustrates a perspective view of a welding column combination 150e in accordance with still another embodiment of the present disclosure, and FIG. 10 illustrates an exploded view of the welding column combination 150e. Different from the welding column combination 150, the insulator block 156" in this embodiment has its insulation gap portion 156a withdrawal from in four sides. In this embodiment, the insulation gap portion 156a has merely one protrusion engaging portion 156d at two opposite sides and has a triangular cross section. Two metal welding columns 152", 154" has respective through holes 152d, 154d in triangular shape configured to be inserted by corresponding protrusion engaging portions 156d. In this embodiment, two metal welding columns have the same structural shapes.

Figure 11:
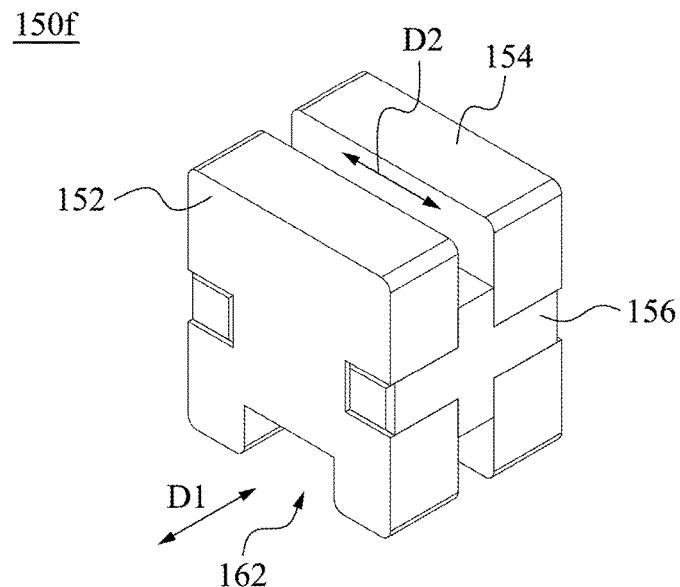
FIG. 11 illustrates a perspective view of a welding column combination in accordance with still another embodiment of the present disclosure.
Figure 12:
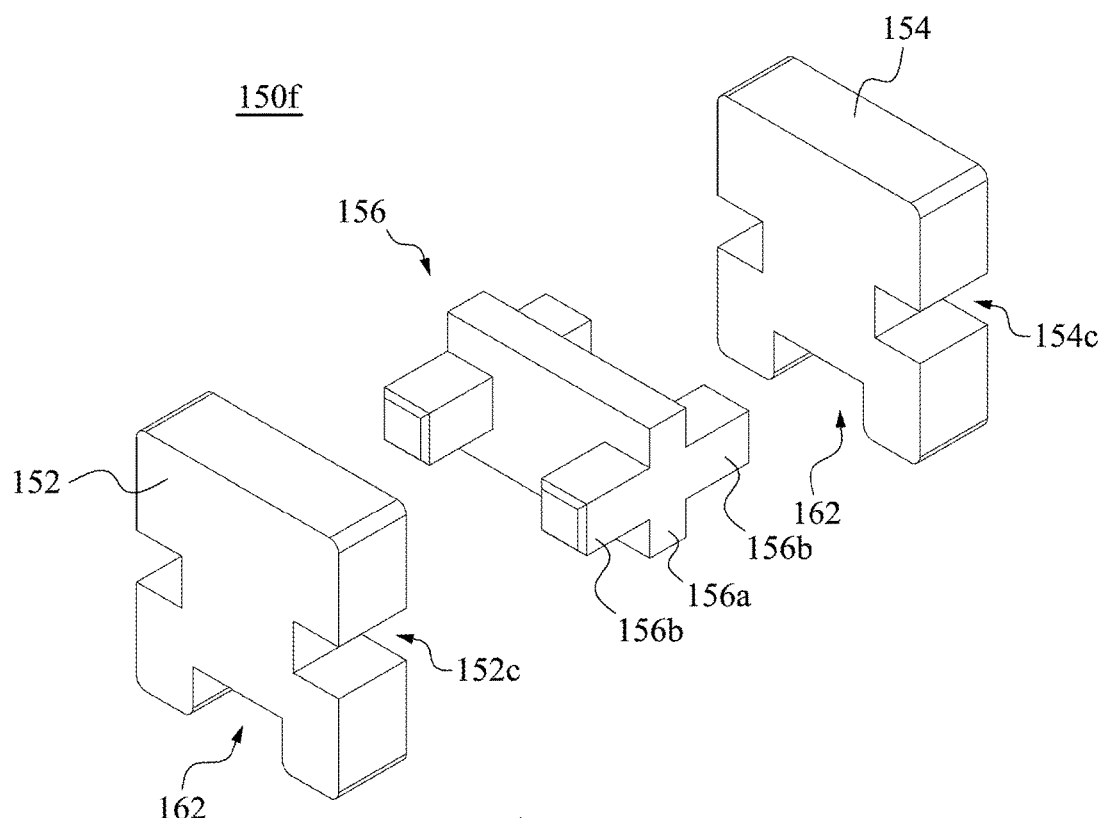
FIG. 12 illustrates an exploded view of the welding column combination in FIG. 11.
Figure 13:
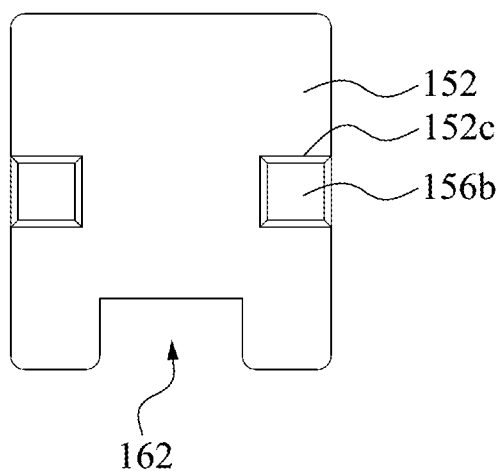
FIG. 13 illustrates a side view of the welding column combination in FIG. 11.

FIG. 11 illustrates a perspective view of a welding column combination 150f in accordance with still another embodiment of the present disclosure, FIG. 12 illustrates an exploded view of the welding column combination 150f, and FIG. 13 illustrates a side view of the welding column combination 150f. Different form the welding column combination 150, the welding column combination 150f in this embodiment has a greater height such that its bottom may has an open slot 162 allowing a small component hidden inside to enhance an integration and power density of the power supply module. The open slot 162 may be located at a top end of the metal welding column, not limited to the bottom end of the metal welding column as shown in FIGS. 11-13. As shown in FIG. 13, two metal welding columns 152, 154 have respective open slots 162 aligned and continuous such that a long component may be hidden inside the continuous open slots 162. In this embodiment, two metal welding columns have the same structural shapes. In other embodiments, only one metal welding column has an open slot at its first end or second end, or has an open slot at its first end and second end. In other embodiments, one metal welding column has an open slot at its first end or second end, or has an open slot at its first end and second end, and the other metal welding column does not have an open slot at its first end and second end. In other embodiments, one metal welding column has an open slot at its first end, and the other metal welding column has an open slot at its second end. The metal welding column may have its open slot located at the needed end(s) according to actual needs and not be limited to above-discussed embodiments.

The foregoing metal welding columns may be stamped or made by a machine first, and then combined with an insulator block by a plastic injection mold to form a welding column combination. Alternatively, the metal welding column and the insulator block are separately formed and assembled, for example, the metal welding column and the insulator block are loosely fitted, are positioned by fixture assembly and then glued together, or the metal welding column and the insulator block are tight fitted, and are pressed together to achieve assembly requirements.

In the discussed embodiments of FIGS. 1-13, the welding column combination has its respective ends, e.g., the first end and the second end, aligned or leveled.

Figure 14:
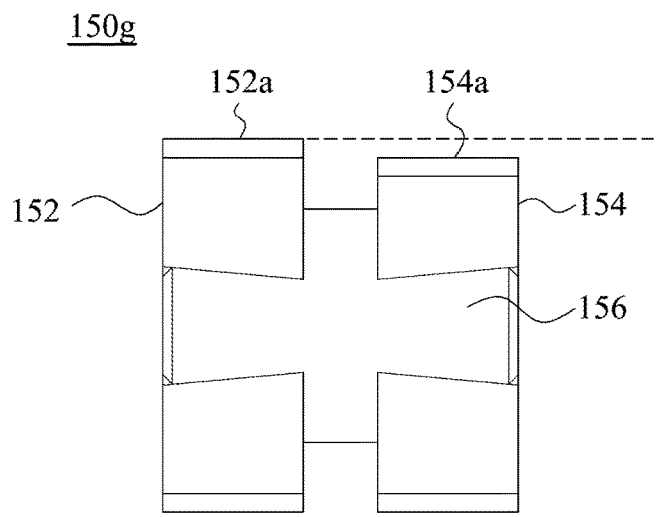
FIG. 14 illustrates a perspective view of a welding column combination with welding surfaces not level in accordance with an embodiment of the present disclosure.
Figure 15:
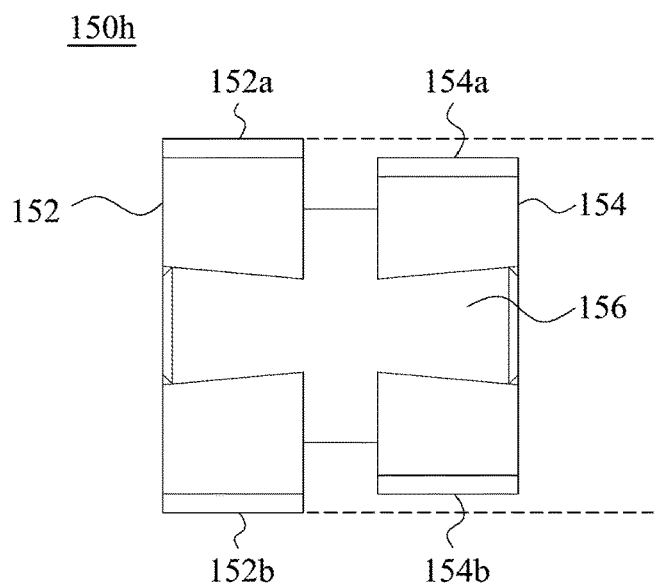
FIG. 15 illustrates a perspective view of a welding column combination with welding surfaces not level in accordance with an embodiment of the present disclosure.
Figure 16:
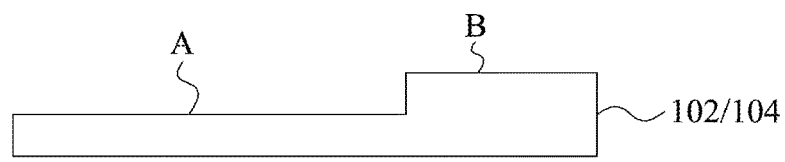
FIG. 16 illustrates a side of a circuit board in accordance with an embodiment of the present disclosure.

Reference is made to FIGS. 14-16, which illustrate the welding column combinations with welding surfaces not aligned or leveled as well as the implemented circuit board. In FIG. 14, the metal welding columns 152, 154 of the welding column combination 150g have their respective ends not aligned or leveled, i.e., one end of the welding surface 152a is not aligned or leveled with one end of the welding surface 154a while the metal welding columns 152, 154 have their another ends aligned or leveled. In other embodiments, the welding column combination in FIG. 14 may be implemented in a power supply module with three circuit boards, and the metal welding columns 152, 154 have welding surfaces at their first ends and second ends. One circuit board is electrically connected to the welding surface at the first end of the metal welding column 152, another circuit board is electrically connected to the welding surface at the first end of the metal welding column 154, and still another circuit board is electrically connected to the welding surfaces at the respective second ends of the metal welding column 152, 154. In other embodiments, the welding column combination in FIG. 14 may be implemented in a power supply module with two circuit boards, and the metal welding columns 152, 154 have welding surfaces at their first ends and second ends. One circuit board with uniform thickness is electrically connected to the welding surfaces at the second end of the metal welding columns 152, 154, and the other circuit board with non-uniform thickness, e.g., the circuit board 102/104 in FIG. 16, is electrically connected to the respective welding surfaces at the first ends of the metal welding columns 152, 154. A surface of the circuit board 102/104, which faces the metal welding columns, has a welding portion A and a welding portion B, the welding portion B forms a convex portion relative to the welding portion A in order to be electrically connected to the respective welding surfaces at the first end of the metal welding columns 152, 154.

In FIG. 15, the metal welding columns 152, 154 of the welding column combination 150h have their first ends and second ends not aligned or leveled, i.e., the welding surface 152a is not aligned or leveled with the welding surface 154a, and the welding surface 152b is not aligned or leveled with the welding surface 154b. In other embodiments, the welding column combination in FIG. 15 may be implemented in a power supply module with four circuit boards, and the metal welding columns 152, 154 have welding surfaces at their first ends and second ends not aligned or leveled. Two circuit boards are electrically connected to the respective welding surfaces at the first ends of the metal welding columns 152, 154, and the other two circuit boards are electrically connected to the respective welding surfaces at the second ends of the metal welding columns 152, 154. In other embodiments, the welding column combination in FIG. 15 may be implemented in a power supply module with two circuit boards, and the metal welding columns 152, 154 have respective welding surfaces at their first ends and second ends not aligned or leveled. One circuit board with non-uniform thickness is electrically connected to the respective welding surfaces at the first ends of the metal welding columns 152, 154, and the other circuit board with non-uniform thickness is electrically connected to the respective welding surfaces at the second ends of the metal welding columns 152, 154. The circuit board with non-uniform thickness may be the circuit board 102/104 as illustrated in FIG. 16. A surface of the circuit board 102/104 of FIG. 16, which faces the metal welding columns, has a welding portion A and a welding portion B, the welding portion B forms a convex portion relative to the welding portion A in order to be electrically connected to the respective welding surfaces at the first ends or at the second ends of the metal welding columns 152, 154.

It is noted that the welding column combination may have its first ends and/or second ends aligned or leveled, or not aligned or not leveled according to actual needs, and not be limited to above-discussed embodiments.

In summary, the welding column combination of the present disclosure can reduce the height/width ratio of the overall structure of the metal welding column by using an insulator block and at least two metal welding columns with a larger height/width ratio such that the welding column combination can stand upright reliably. The welding column combination is absorbed by only one time during the process while multiple independent metal welding columns is absorbed by multiple times during the process. In comparison, the welding column combination is more efficient in the SMD process. The design of the welding column combination also provides more space for stacking more pieces of circuit boards and improves the output power density and integration for the power supply module.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A welding column combination comprising:
   at least two metal welding columns, each metal welding column having a first end and a second end opposite to the first end, wherein at least one of the metal welding columns has welding surfaces at the first end and the second end respectively; and
   at least one insulator block assembling the at least two metal welding columns as a unitary physical combination, wherein the insulator block comprises at least one insulation gap portion and at least two protrusion engaging portions, the insulation gap portion is configured to space adjacent-two of the at least two metal welding columns from each other.

2. The welding column combination of claim 1, wherein a height/width ratio of at least one of the at least two metal welding columns is greater than or equal to one.

3. The welding column combination of claim 1, wherein a height/width ratio of at least one of the at least two metal welding columns is less than one.

4. The welding column combination of claim 1, wherein a material of each metal welding column comprises copper, copper alloys, silver or silver alloys.

5. The welding column combination of claim 1, wherein a material of the insulator block comprises plastic.

6. The welding column combination of claim 1, wherein a height/width ratio of the welding column combination is less than two.

7. The welding column combination of claim 1, wherein each protrusion engaging portion has a width near the insulation gap portion less than a width away from the insulation gap portion.

8. The welding column combination of claim 1, wherein the at least two metal welding columns are of the same shapes or different shapes.

9. The welding column combination of claim 1, wherein each metal welding column has at least one through hole or concave slot configured to be inserted by a corresponding one of the at least two protrusion engaging portions.

10. The welding column combination of claim 1, wherein each protrusion engaging portion has a rectangular, semi-circular or triangular cross section.

11. A power supply module comprising:
at least one circuit board; and
the welding column combination of claim 1 installed on the at least one circuit board and the welding surfaces of the at least two metal welding columns are welded to the at least one circuit board.

12. The power supply module of claim 11, wherein the at least one circuit board comprises a first circuit board and a second circuit board, wherein at least one of the at least two metal welding columns has the welding surface at the first end and the welding surface at the second end welded to the first circuit board and the second circuit board respectively; or wherein the at least two metal welding columns have the welding surfaces at the first end and the second end.

13. The power supply module of claim 11, wherein the at least one circuit board is a printed circuit board or aluminum based circuit board.

14. The power supply module of claim 11, wherein a surface of the at least one circuit board is in contact with the welding surfaces of the at least two metal welding columns, and the surface of the at least one circuit board has at least one convex portion.

* * * * *